(12) United States Patent
Veryeras et al.

(10) Patent No.: US 9,746,372 B2
(45) Date of Patent: Aug. 29, 2017

(54) RECEIVER OF A PULSED LIGHT SIGNAL WITH WIDE DYNAMIC RANGE

(71) Applicant: THALES, Courbevoie (FR)

(72) Inventors: Alexandre Veryeras, Montigny-le-bretonneux (FR); Daniel Passelaigue, Maule (FR)

(73) Assignee: FRANCE BREVETS, Paris (FR)

( * ) Notice: Subject to any disclaimer, the term of this patent is extended or adjusted under 35 U.S.C. 154(b) by 172 days.

(21) Appl. No.: 14/441,822

(22) PCT Filed: Nov. 6, 2013

(86) PCT No.: PCT/EP2013/073198
§ 371 (c)(1),
(2) Date: May 8, 2015

(87) PCT Pub. No.: WO2014/072362
PCT Pub. Date: May 15, 2014

(65) Prior Publication Data
US 2015/0292942 A1     Oct. 15, 2015

(30) Foreign Application Priority Data
Nov. 9, 2012     (FR) .................................... 12 03012

(51) Int. Cl.
| | |
|---|---|
| *G01J 1/46* | (2006.01) |
| *H03F 3/08* | (2006.01) |
| *G01S 7/486* | (2006.01) |
| *G01S 17/08* | (2006.01) |
| *G01J 1/44* | (2006.01) |
| *G01J 1/42* | (2006.01) |

(52) U.S. Cl.
CPC .............. *G01J 1/46* (2013.01); *G01S 7/4861* (2013.01); *G01S 17/08* (2013.01); *H03F 3/08* (2013.01); *G01J 2001/4238* (2013.01); *G01J 2001/4406* (2013.01); *G01J 2001/446* (2013.01)

(58) Field of Classification Search
CPC ..... H03F 1/08; H03F 1/26; H03F 1/30; H03F 3/45475; H03F 3/087; H03F 2203/45521; H03F 2200/372
See application file for complete search history.

(56) References Cited

U.S. PATENT DOCUMENTS

| | | |
|---|---|---|
| 4,415,803 A | 11/1983 | Muoi |
| 6,862,322 B1 | 3/2005 | Ewen et al. |
| 2004/0036012 A1 | 2/2004 | Horiguchi et al. |
| 2006/0001493 A1 | 1/2006 | Harms et al. |
| 2006/0034621 A1* | 2/2006 | Denoyer ................ H03F 1/08 398/208 |

* cited by examiner

Primary Examiner — Luke Ratcliffe
(74) Attorney, Agent, or Firm — Baker & Hostetler LLP

(57) ABSTRACT

A receiver of a pulsed light signal comprises a photodiode adapted to generate an electric current in response to this light signal, having a parasitic capacitance $C_d$ as its characteristic; an electrical ground; and a transimpedance amplifier connected to the input of the photodiode by a linking capacitor $C_{liaison}$. It includes an attenuation pad located between the photodiode and the transimpedance amplifier, consisting of a capacitor $C_p$ where $C_p=C_d/(\alpha-1)$, $\alpha$ being a predetermined attenuation, where $\alpha>1$.

17 Claims, 7 Drawing Sheets

RECEIVER OF A PULSED LIGHT SIGNAL WITH WIDE DYNAMIC RANGE

CROSS-REFERENCE TO RELATED APPLICATIONS

This application is a National Stage of International patent application PCT/EP2013/073198, filed on Nov. 6, 2013, which claims priority to foreign French patent application No. FR 1203012, filed on Nov. 9, 2012, the disclosures of which are incorporated by reference in their entirety.

FIELD OF THE INVENTION

The field of the invention is that of a photodiode receiver which receives light pulses over a very wide dynamic range (from several nanoamperes to several tens of milliamperes). This dynamic range is provided by means of a device for gain switching by discrete values, called "pads".

BACKGROUND

The most commonly used solution for producing such a receiver is that of providing a photodiode with a TIA (an acronym for the English expression "Transimpedance Amplifier"); the sensitivity performance is dependent on this TIA, which has a high gain bandwidth product (or "GBW", an acronym for the English expression "Gain Bandwidth Product") and very low noise.

A photodiode 1 is conventionally represented by the circuit shown in FIG. 1a. As shown in the left-hand figure, this photodiode is preferably charged by a resistor $R'_d$ between the anode and the ground so as to absorb the direct current due to the ambient illumination, also called the background current, which is included in the light signal received by the photodiode. According to the equivalent representation shown in the right-hand figure, this resistor $R'_d$ in parallel with the internal resistance of the photodiode forms an equivalent resistor Rd. The photodiode is generally characterized by a capacitance Cd between the anode and the ground, shown in the right-hand figure.

In a conventional receiver circuit, an example of which is shown in FIG. 1b, a photodiode 1 of this type is associated with a TIA 2 via a linking capacitor $C_{liaison}$ which helps to separate the useful pulses from the background current. The value of this linking capacitor $C_{liaison}$ is typically more than 10 nF. Let us recall that a TIA comprises, in parallel, an operational amplifier AOP or an amplifier with discrete components, a feedback resistor $R_f$ and a stabilizing capacitor $C_f$. Such a receiver makes it possible to neutralize the effect of the parasitic capacitance $C_d$ of the photodiode by means of a virtual ground.

To a first approximation, this is a second-order loop system:
Having a conversion gain $Z_T(p)$ such that $$Z_T(p) = \frac{V_s}{i_D} = -R_f \frac{1}{1 + \frac{2\zeta}{\omega_n}p + \frac{p^2}{\omega_n^2}} \quad \text{(eq 1)}$$

where $V_s$ is the output voltage of the circuit, $i_D$ is the current generated by the photodiode, p ($p = j\omega = j2\pi f$) is the Laplace variable, $R_f$ is the feedback resistance of the TIA, and ξ is the damping of the receiver, and having a natural frequency $\omega_n$ such that:

$$\omega_n = \sqrt{\frac{2\pi GBW}{R_f(C_d + C_f)}} \quad \text{(eq 2)}$$

The ratio of damping to natural frequency can be written thus:

$$\frac{\zeta}{\omega_n} = \frac{1}{2}\left(R_f C_f + \frac{1}{2\pi GBW}\left(1 + \frac{R_f}{R_d}\right)\right) \quad \text{(eq 3)}$$

or in practice:

$$R_f C_f \gg \frac{1}{2\pi GBW}\left(1 + \frac{R_f}{R_d}\right) \quad \text{(eq 4)}$$

this ratio then takes the simple form:

$$\frac{\zeta}{\omega_n} \approx \frac{1}{2} R_f C_f \quad \text{(eq 5)}$$

The gain modification is found according to Equation (1) from the change in the value $R_f$ which, according to Equation (2), modifies the natural frequency $\omega_n$ and hence the damping ξ according to Equation (5). With a conventional solution, therefore, it appears to be difficult to change the gain without modifying the transfer function.

The frequency response is shown in FIG. 5a for three damping values ξ (0.9, 0.7 and 0.5). This figure demonstrates that the change in gain affects the damping when the band is kept constant.

Another important criterion is the equivalent current noise applied to the input of the TIA, which is written thus:

$$i_n = \sqrt{i_{n-}^2 + \left(\frac{e_n}{R_f}\right)^2 + \frac{4kT}{R_f}} \quad \text{(eq 6)}$$

where $i_{n-}$ and $e_n$, respectively, are the equivalent noise current at the negative input of the operational amplifier AOP and the equivalent noise voltage at the input of AOP which characterize the operational amplifier used, k is the Boltzmann constant, and T is the temperature in degrees Kelvin.

For a given TIA and a given photodiode, the sensitivity is optimized by choosing the highest possible resistance $R_f$ compatible with the pulse processing band.

However, as the gain increases, the admittance decreases, because the voltage range at the output of the amplifier is fixed by the power supplies. Conversely, a decrease in gain increases the admittance but degrades the noise, with a current limitation determined by the maximum output current of the amplifier.

The problem therefore arises of providing an optimum receiver for weak signals but also for strong signals, while preferably maintaining the same frequency response. The conventional solutions are:

Reducing the gain of the TIA by reducing the feedback resistor $R_f$ which determines the conversion gain of the TIA, thereby improving the admittance but worsening the noise. Furthermore, reducing the feedback resistance has the effect of significantly increasing the bandwidth, which is evidently undesirable if a pulse shape independent of gain is required.

Placing a switched resistive attenuator between the photodiode and the TIA so as to reduce the gain when the received level exceeds the admittance. This degrades the noise, because the resistances generate noise. Moreover, the switches have non-negligible parasitic capacitance relative to the capacitance of the photodiode, which affects the transfer function.

The conventional solutions do not meet the requirement.

Consequently there is still a need for a receiver with a wide dynamic range, optimized in terms of noise.

SUMMARY OF THE INVENTION

More precisely, the invention proposes a receiver of a pulsed light signal comprising:
- a photodiode adapted to generate an electric current $I_d$ in response to the light signal, having a parasitic capacitance $C_d$ as its characteristic,
- an electrical ground, and
- a transimpedance amplifier connected to the input of the photodiode by a linking capacitor $C_{liaison}$.

It is primarily characterized in that it includes a series-parallel reactive circuit, consisting of a capacitor $C_p$ which, combined with the diode capacitance $C_d$, forms a current divider, called an attenuation pad, upstream of the transimpedance amplifier.

This current divider enables the signal to be attenuated without degrading the noise.

The capacitor Cp is typically placed in series with the linking capacitor and generally supplements it.

According to one characteristic of the invention, the receiver includes a background current resistor $R_d$ located between the photodiode and the electrical ground, the capacitance $C_d$ and said resistor $R_d$ having an impedance $Z_d$, and the attenuation pad also consists of a resistor $R_p$ in parallel with the capacitor $C_p$, thus forming a parallel electrical network called an aperiodic attenuation pad, having an impedance $Z_p$, where $$Z_p = (\alpha-1) Z_d.$$

This aperiodic attenuation pad can be used to compensate the effect of the resistor Rd and thereby maintain the low frequency response of the receiver.

If required, the attenuation pad further comprises a switch in parallel with the capacitor $C_p$, so as to produce a switchable attenuation pad. This switch enables the circuit $R_p C_p$ to be short-circuited or switched.

The attenuation pad may also include a capacitor $C_{opt}$ in parallel with $C_d$, this capacitor $C_{opt}$ itself being switchable if required.

The aperiodic attenuation pad may also comprise a compensation capacitor $C_{comp}$ in parallel with the input of the transimpedance amplifier, thus forming a compensated aperiodic attenuation pad, with $C_{comp} = C_d(\alpha-1)/\alpha$, this compensation capacitor being switchable if required.

Given that the assembly consisting of the attenuation pad and the transimpedance amplifier is called a receiving channel with attenuation pad, the receiver further comprises a receiving channel without attenuation pad, comprising another transimpedance amplifier, these receiving channels being multiplexed by means of an input switch of these channels and an output switch of these channels, the switches being synchronized with one another so as to produce a receiver with different gains. Evidently, other receiving channels with attenuation pads may be multiplexed with said receiving channels, each receiving channel with an attenuation pad having a different attenuation.

The light signal is typically capable of generating current pulses in the range from 10 nA to 100 mA in the photodiode.

BRIEF DESCRIPTION OF THE DRAWINGS

Other characteristics and advantages of the invention will be revealed by the following detailed description, provided by way of non-limiting example, with reference to the attached drawings, in which.

The same elements are identified by the same references in all the figures.

DETAILED DESCRIPTION

The receiver according to the invention is based on the principle of a current divider bridge which is capacitive instead of resistive.

Figure 1A:
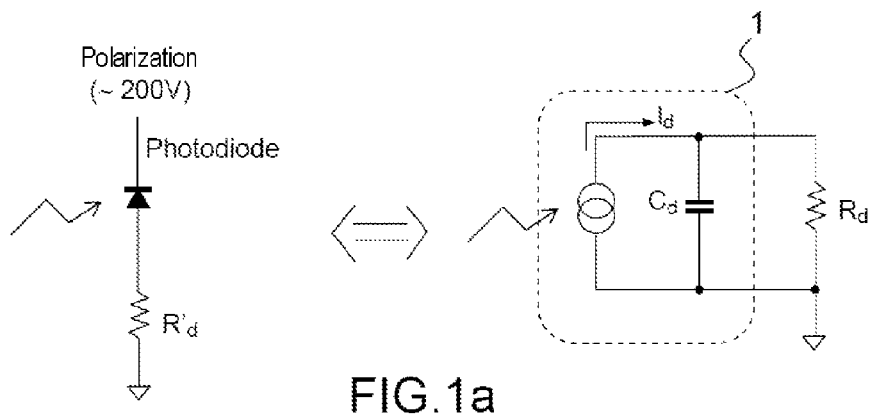
FIG. 1a, described above, shows two equivalent schematic representations of a photodiode having a background resistor.
Figure 1B:
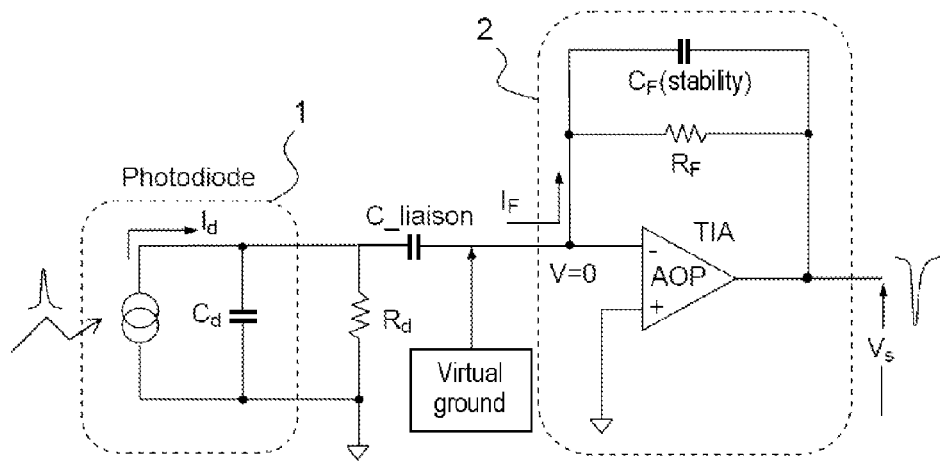
FIG. 1b shows schematically a receiver circuit according to the prior art, including a photodiode and a TIA.
Figure 2:
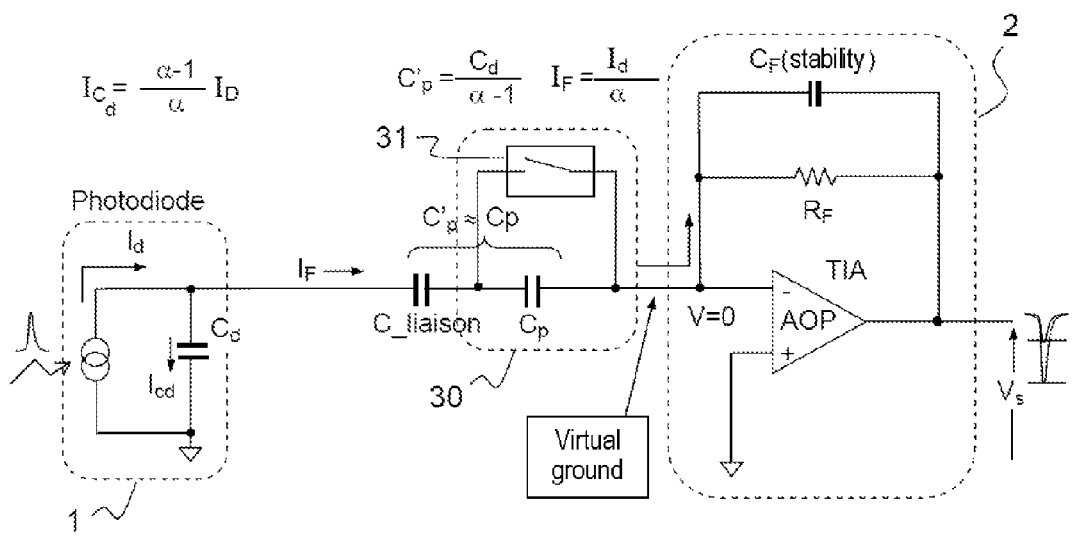
FIG. 2 shows schematically an example of a receiver circuit according to a first embodiment of the invention with a purely capacitive attenuation pad.

An example of a capacitive attenuation pad associated with a photodiode 1 equipped with a TIA 2 is shown in FIG. 2. In this figure, the aim is more particularly to indicate the electrical currents.

The photodiode is an ideal current generator, and is capacitive because of the parasitic capacitance Cd. When a capacitor Cp is added in series between the TIA 2 and the photodiode 1, at the input or output of the linking capacitor, the current generated by the photodiode is distributed between the capacitance Cd and the capacitor Cp as a function of the values of the capacitances:

$$I_F = \frac{I_D}{\alpha}$$

via the capacitance $C_p$;

$$I_{Cd} = \frac{\alpha-1}{\alpha} I_D$$

via the capacitance $C_d$;

The value of the capacitance $$C_p = \frac{C_d}{\alpha - 1}$$

determines the attenuation $$\alpha = \frac{C_d + C_p}{C_p}$$

of the capacitive divider. The signal is therefore attenuated without the addition of supplementary noise.

We find that $\alpha > 1$; in practice, an attenuation $\alpha$ typically in the range from 2 to 30 is chosen. The value of $C_p$ is typically less than 10 pF.

This attenuation pad 30 consisting of the capacitor Cp is provided, if required, with a switch 31 placed in parallel with this capacitor Cp to adapt the gain to the received level.

Let us analyze in greater detail the behavior of such a receiver at low frequencies, that is to say below 100 kHz:

As indicated in the preamble, the photodiode 1 is generally charged by a resistor Rd so as to absorb the direct current due to the ambient illumination. This resistor Rd modifies the impedance of the photodiode, which can then no longer be considered as purely capacitive.

Figure 3A:
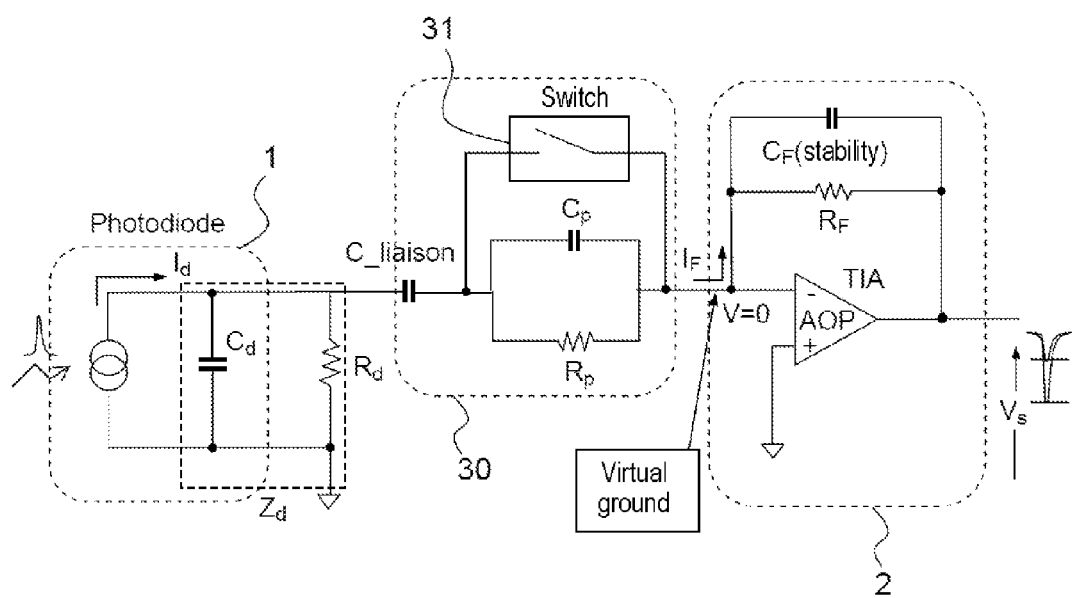
FIG. 3a shows schematically an example of a receiver circuit according to a second embodiment of the invention, with an aperiodic attenuation pad switched around Rp Cp.

As shown in FIG. 3a, the capacitor Cp is then supplemented with a resistor Rp in parallel, which forms, with this capacitor, a parallel electrical network called an aperiodic attenuation pad 30 having an impedance Zp, proportional to Zd which is the impedance of the diode circuit including the resistance $R_d$ and the capacitor $C_d$ in parallel.

Assuming that $Zp=(\alpha-1)Zd$, we find:

$$\begin{cases} I_F = \frac{I_D}{\alpha} \\ R_p = (\alpha - 1)R_d \\ C_p = \frac{1}{(\alpha - 1)}C_d \end{cases}$$

$I_F$ being the output current of the attenuation pad 30.

The attenuation of the current then becomes independent of frequency, the additional noise remaining very low because the resistor Rp is large relative to Rd, owing to the attenuation ratio $\alpha$.

This aperiodic attenuation pad 30 is provided, if required, with a switch 31 placed in parallel with Rp and Cp.

Figure 5A:
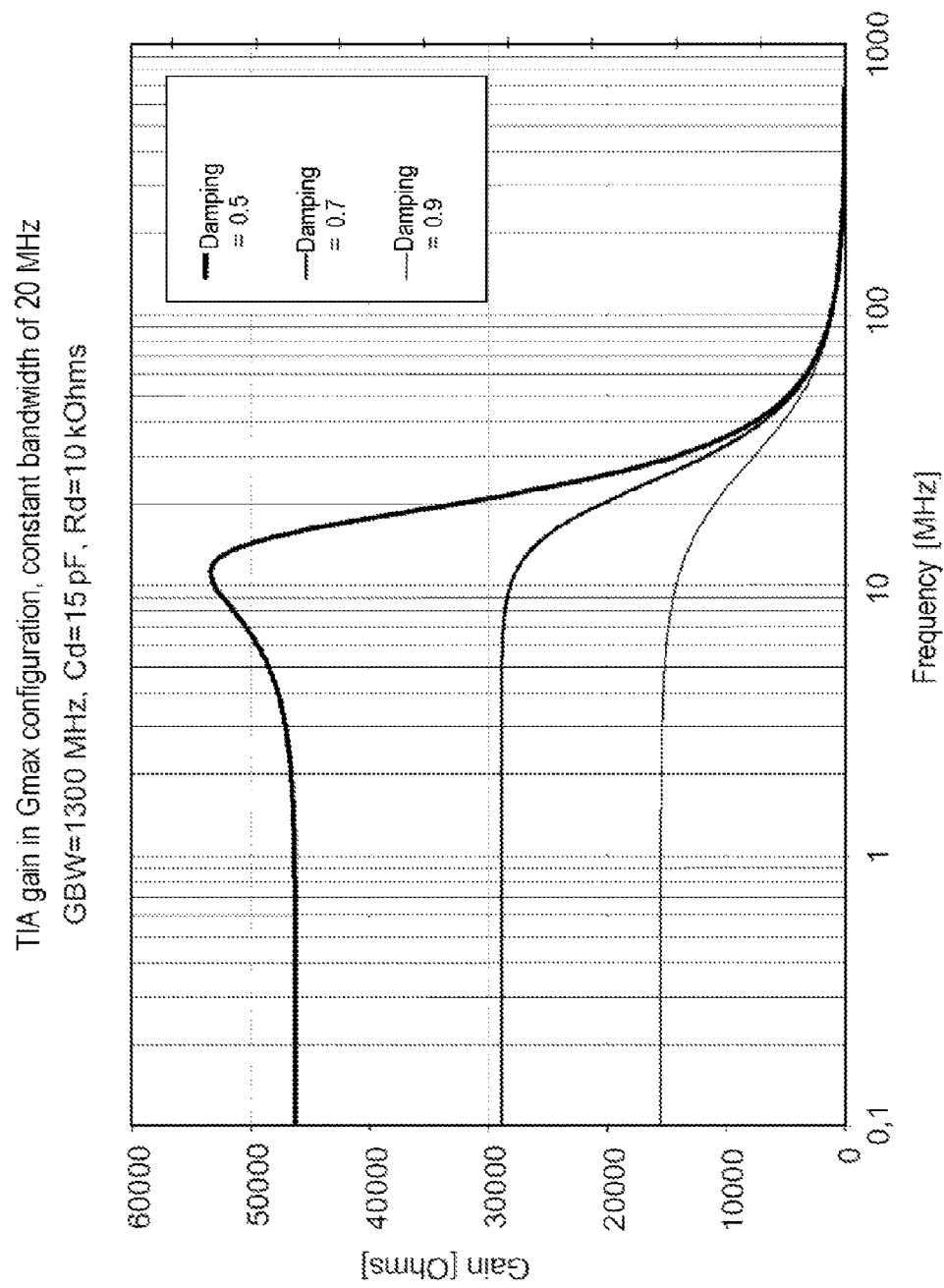
FIG. 5a shows the frequency response of a conventional receiver with constant bandwidth for three values of gain, showing a variation in damping.
Figure 5B:
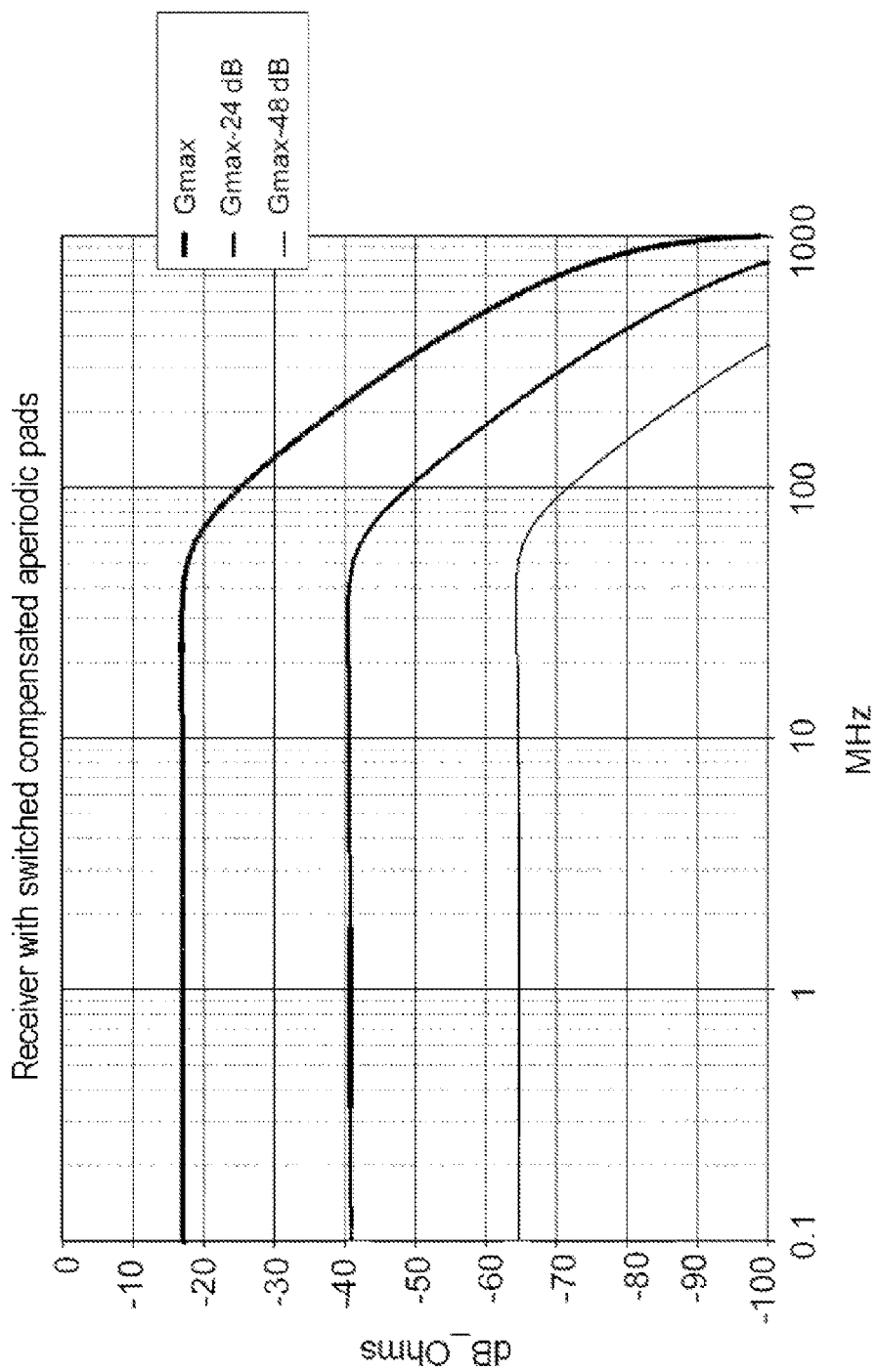
FIG. 5b shows the frequency response of a receiver with a compensated aperiodic pad with a constant bandwidth for three values of gain, showing how the damping is maintained.

Let us now analyze in greater detail the behavior of such a receiver at high frequencies, that is to say above 10 MHz:

With the previous receiver circuit, the TIA 2 no longer sees the same impedance when the attenuation pad is active, and its transfer function is affected by this, as shown in FIG. 5a for curves of gain as a function of frequency for three values of damping $\xi$(0.9, 0.7 and 0.5). The circuit behaves as a second-order system.

The ratio of damping to natural frequency is:

$$\frac{\hat{\zeta}}{\hat{\omega}_n} = \frac{1}{2} \cdot \left[ R_f \cdot C_f + \frac{1}{2 \cdot \pi \cdot GBW} \cdot \left(1 + \frac{R_f}{a \cdot R_d}\right)\right]$$

When the condition of a sufficient product of gain×band is met:

$$R_f \cdot C_f \gg \frac{1}{2\pi \, GBW}\left(1 + \frac{R_f}{a \, R_d}\right)$$

the ratio of damping to natural frequency remains constant:

$$\frac{\hat{\zeta}}{\hat{\omega}_n} = \frac{\zeta}{\omega_n} \cong \frac{1}{2} R_f C_f$$

But:

The natural frequency $\hat{\omega}_n$ corresponds to that of a circuit whose photodiode has a parasitic capacitance which is reduced by a ratio $\alpha$:

$$\omega_n = \sqrt{\frac{2\pi \, GBW}{R_f(C_d + C_f)}} \Rightarrow \hat{\omega}_n = \sqrt{\frac{2\pi \, GBW}{R_f\left(\frac{C_d}{\alpha} + C_f\right)}}$$

The static gain $Z_T$ is divided by $\alpha$, as desired:

$$Z_T = -R_f \frac{1}{1 + \frac{2\zeta}{\omega_n}p + \frac{p^2}{\omega_n^2}} \Rightarrow \hat{Z}_T = \frac{-R_f}{\alpha} \times \frac{1}{1 + \frac{2\hat{\zeta}}{\hat{\omega}_n}p + \frac{p^2}{\hat{\omega}_n^2}}$$

Since an attenuation $\alpha$ is created, the natural frequency $\hat{\omega}_n$ of the receiver also increases, but the damping increases because the ratio of damping to natural frequency remains constant.

To retain the same bandwidth with and without attenuation, the damping must be modified; compensation is therefore added to produce the same transfer function.

Figure 3B:
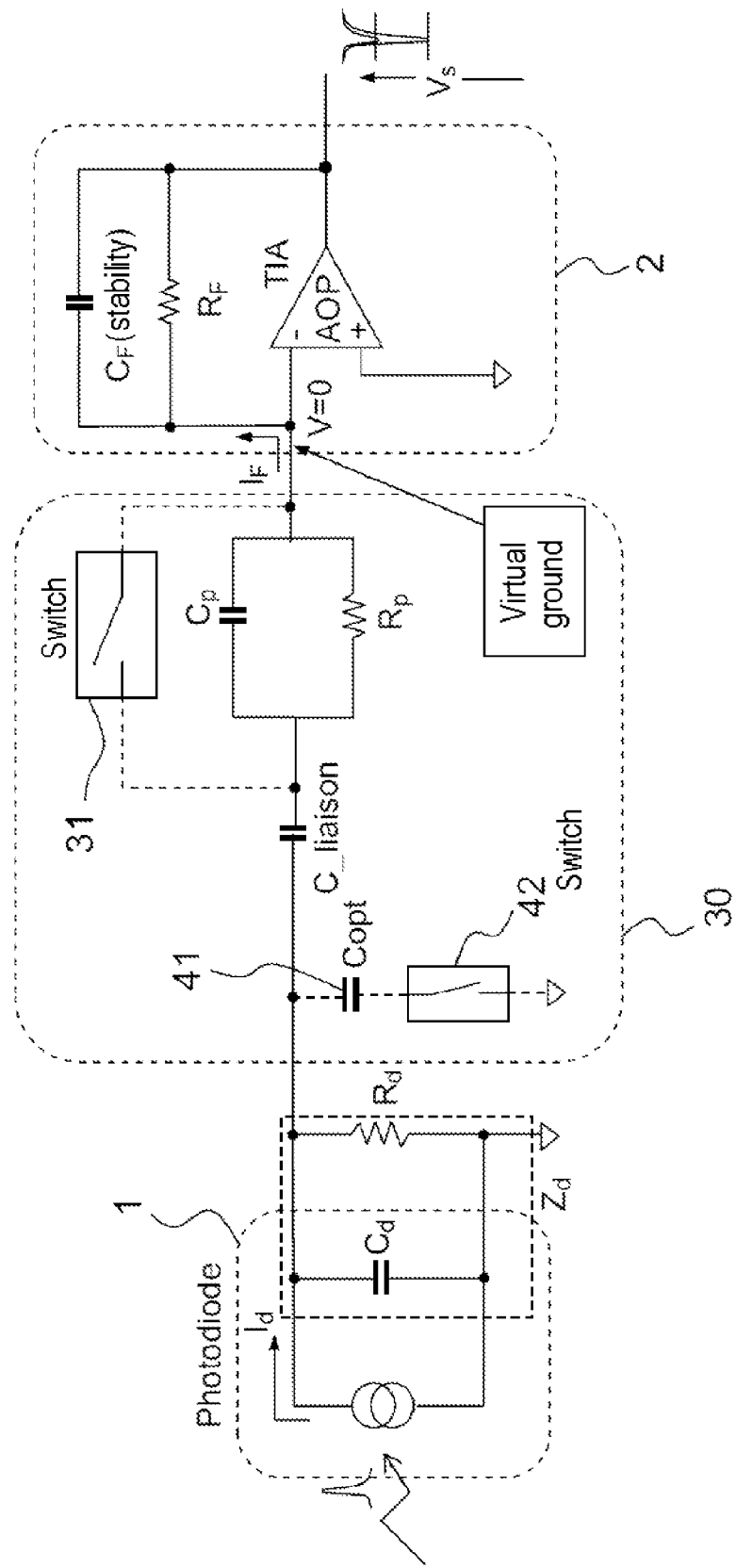
FIG. 3b shows schematically an example of a receiver circuit according to a third embodiment of the invention, with an aperiodic attenuation pad switched around Cd.
Figure 3C:
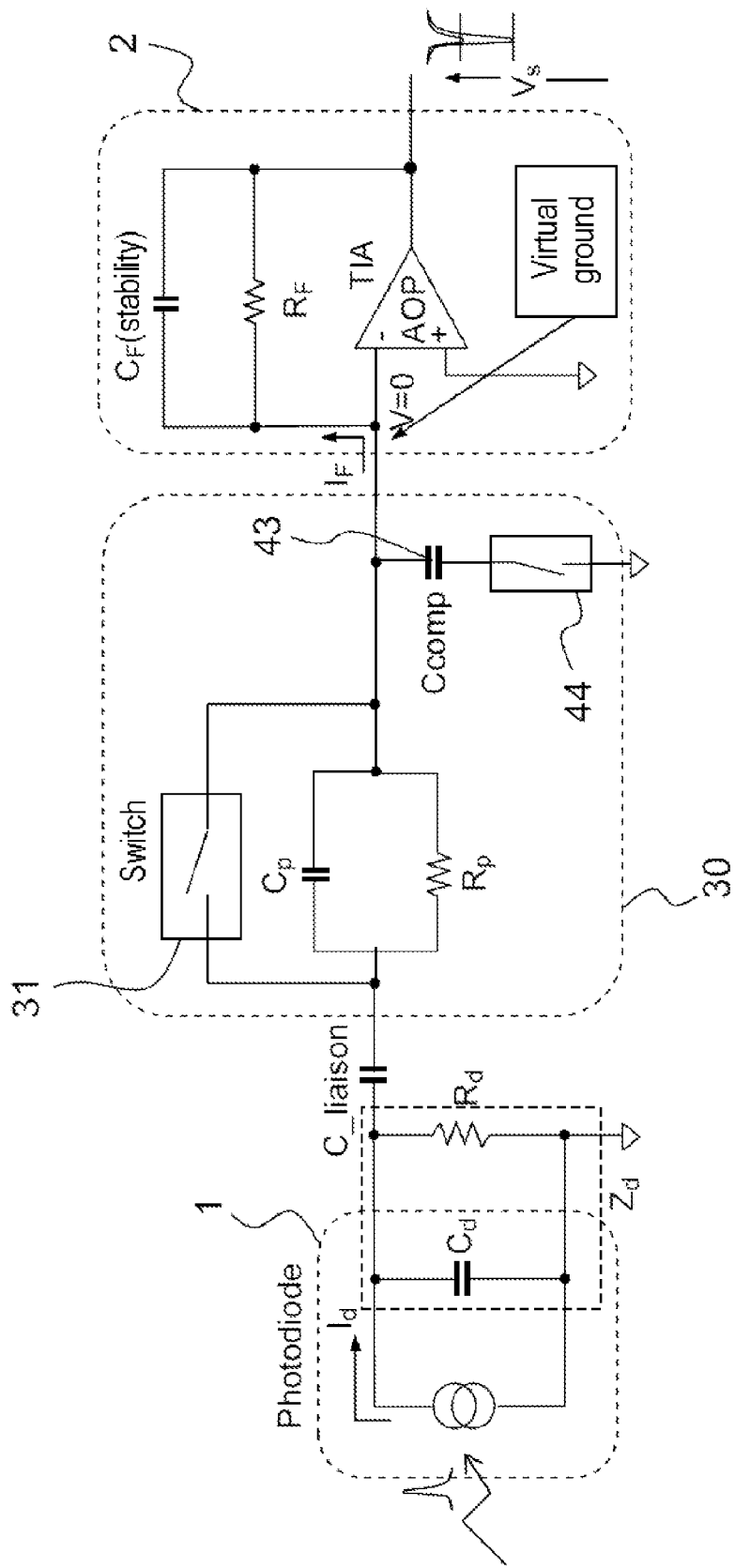
FIG. 3c shows schematically an example of a receiver circuit according to a fourth embodiment of the invention, with a compensated aperiodic attenuation pad.

Since the ratio of damping to natural frequency is invariant, the damping and the natural frequency are maintained simultaneously by adding a compensation capacitor $C_{comp}$ 43 shown in FIG. 3c, in parallel on the input of the TIA 2, such that:

$$\omega_n = \hat{\omega}_n \Leftrightarrow \sqrt{\frac{2\pi \, GBW}{R_f\left(\frac{C_d}{\alpha} + C_{COMP} + C_f\right)}} = \sqrt{\frac{2\pi \, GBW}{R_f(C_d + C_f)}}$$

Therefore:

$$C_{comp} = \frac{\alpha - 1}{\alpha} C_d$$

The aperiodic attenuation pad modified in this way is then called a "compensated aperiodic attenuation pad".

Such a receiver exhibits the same transfer function regardless of whether or not the pad is active.

In addition to the switch 31 (the first switch), another switch 44 may be placed in series with the compensation capacitor $C_{comp}$, between the latter and the ground. The compensated aperiodic attenuation pad 30 operates when this other switch 44 is closed and the first switch 31 is open, and vice versa.

In the definition of the aperiodic pad, the value of the capacitor $C_p$ is related to the capacitance $C_d$ of the detector and to the attenuation ratio. For a value of Cd in the range from 12 to 18 pF, we therefore find, according to the formula $$Cp = \frac{1}{(\alpha-1)} Cd$$

and with α in the range from 10 to 20, a very low value of Cp in the range from 0.5 to 2 pF, which is difficult to control in an industrial context in the production of a circuit. The solution proposed in FIG. 3b consists in artificially increasing the capacitance Cd by adding a capacitor $C_{opt}$ 41 in parallel, thereby enabling the value of Cp to be increased at an equal attenuation. This capacitor $C_{opt}$ can be switched by a switch 42 placed in series toward the ground.

Figure 4:
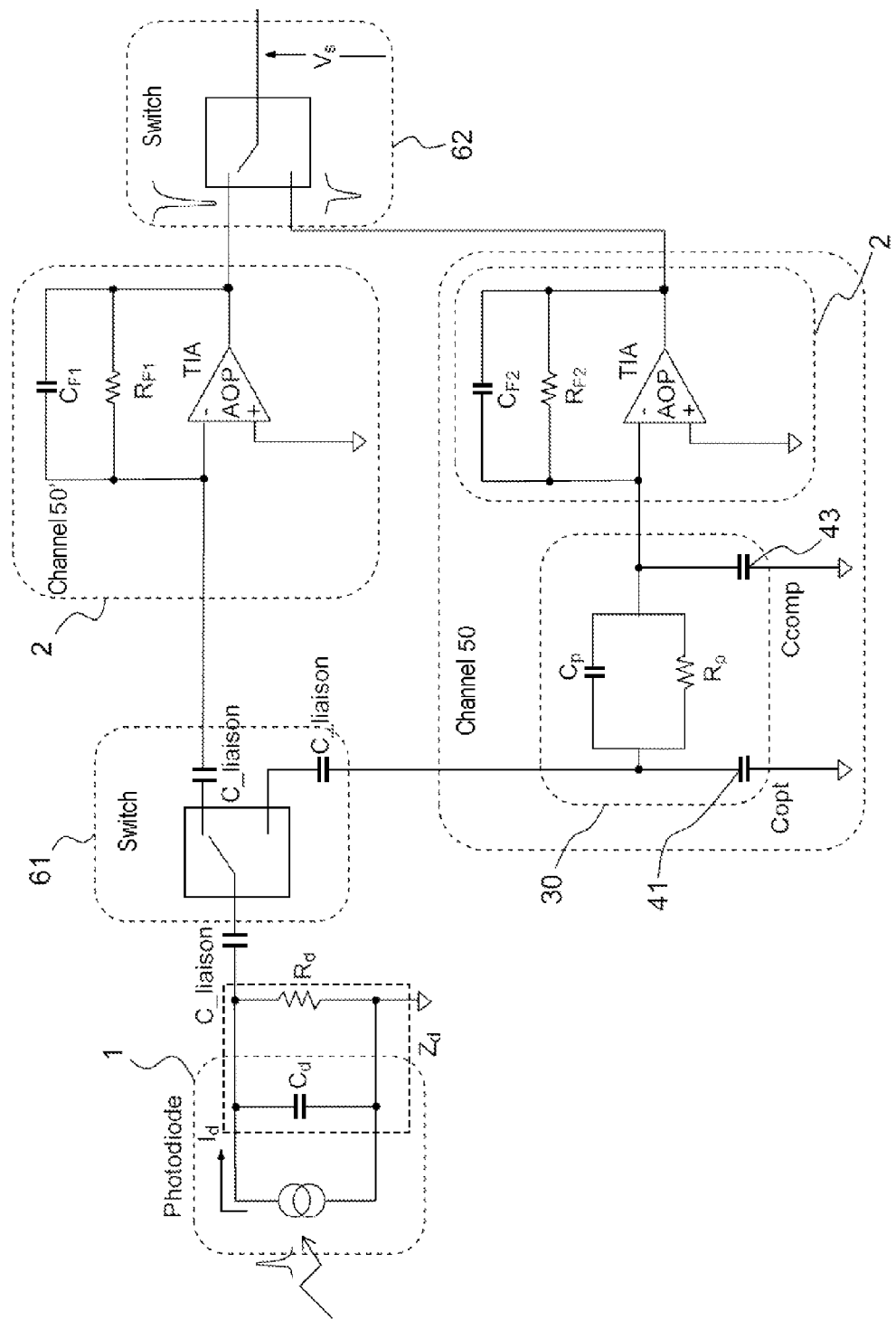
FIG. 4 shows schematically an example of a receiver circuit according to a fifth embodiment of the invention, with a plurality of switched receiving channels.

In practice, switches are imperfect, and fitting them may introduce parasitic elements which, in some cases, may degrade the transfer function. The term "receiving channel with an attenuation pad 50" denotes the assembly consisting of the attenuation pad 30 and the transimpedance amplifier 2. The attenuation pad may or may not be aperiodic, may or may not be switchable, may or may not be compensated, and so forth. A proposed alternative is to use a plurality of receiving channels, each having a different gain, as shown in FIG. 4 with two values of gain. In this example, the receiver has two receiving channels:
 a receiving channel 50 with a pad, optimized with a compensated aperiodic attenuation pad, and
 a receiving channel 50' without a pad (having only a transimpedance amplifier 2) optimized at maximum gain.

The channel is typically selected by means of a switch 61 located at the input of these channels and a switch 62 located at the output of these channels, these switches being synchronized with one another to produce a receiver with different gains. The input switch 61 is advantageously provided with a linking capacitor on each of its outputs leading to a receiving channel.

The receiver provided with an attenuation pad in this way has the following advantages:
 Greater admittance than a conventional circuit;
 A frequency response independent of the gain;
 Optimized noise;
 Allowance for the parasitic capacitances of the switches;
 No need for a compromise between sensitivity and power behavior;
 Simplicity of production.

This receiver is typically integrated into a Lidar system. It may be used as an element of a distance gauge, notably a semi-active distance gauge, that is to say one equipped with a designation laser adapted to illuminate a target whose backscatter is measured by this receiver. The target emits, for example, light pulses at a constant level, but if the receiver is at a long distance it can only measure very low-level pulses, whereas it can measure high-level pulses when it is at a short distance.

The invention claimed is:
1. A receiver of a pulsed light signal comprising:
 a photodiode adapted to generate an electric current ($I_D$) in response to said pulsed light signal, having a capacitance $C_d$ as a characteristic,
 an electrical ground, and
 a transimpedance amplifier connected to the input of the photodiode by a linking capacitor $C_{liaison}$, and
 an attenuation pad located between the photodiode and the transimpedance amplifier, consisting of a capacitor $C_p$ where $C_p = C_d/(\alpha-1)$, α being a predetermined attenuation, where α>1.

2. The receiver of a light signal as claimed in claim 1, wherein the capacitor $C_p$ is placed in series with the linking capacitor $C_{liaison}$.

3. The receiver of a light signal as claimed in claim 1, wherein the linking capacitor $C_{liaison}$ is integrated with the capacitor $C_p$.

4. The receiver of a pulsed light signal as claimed in claim 1, comprising a background current resistor $R_d$ located between the photodiode and the electrical ground, the capacitance $C_d$ and said background current resistor $R_d$ having an impedance $Z_d$, and wherein the attenuation pad also consists of a resistor $R_p$ in parallel with the capacitor $C_p$, thus forming a parallel electrical network which is an aperiodic attenuation pad, having an impedance $Z_p$, where $Z_p=(\alpha-1)Z_d$.

5. The receiver of a pulsed light signal as claimed in claim 1, wherein the attenuation pad further includes a switch in parallel with the capacitor $C_p$, so as to produce a switchable attenuation pad.

6. The receiver of a pulsed light signal as claimed in claim 1, wherein the attenuation pad further includes a capacitor $C_{opt}$ in parallel with the capacitance $C_d$.

7. The receiver of a pulsed light signal as claimed in claim 6, wherein the attenuation pad further includes a switch in series with the capacitor $C_{opt}$.

8. The receiver of a pulsed light signal as claimed in claim 1, comprising a background current resistor $R_d$ located between the photodiode and the electrical ground, the capacitance $C_d$ and said background current resistor $R_d$ having an impedance $Z_d$, and wherein the attenuation pad also consists of a resistor $R_P$ in parallel with the capacitor $C_P$, thus forming a parallel electrical network which is an aperiodic attenuation pad, having an impedance $Z_P$, where $Z_P=(\alpha-1)Z_d$, wherein the aperiodic attenuation pad also consists of a compensation capacitor $C_{comp}$ in parallel with the input of the transimpedance amplifier, thus forming a compensated aperiodic attenuation pad, with $C_{comp}=C_d(\alpha-1)/\alpha$.

9. The receiver of a pulsed light signal as claimed in claim 8, wherein the attenuation pad further includes a switch in parallel with the capacitor $C_P$, so as to produce a switchable attenuation pad, and the receiver further comprising a switch in series with the compensation capacitor and connected to the ground, so as to produce a switchable compensation capacitor.

10. The receiver of a pulsed light signal as claimed in claim 1, wherein, the assembly consisting of the attenuation pad and the transimpedance amplifier being called a receiving channel with an attenuation pad, the receiver further comprises a receiving channel without an attenuation pad, comprising another transimpedance amplifier, these receiving channels being multiplexed by means of an input switch of these channels and an output switch of these channels, the switches being synchronized with one another so as to produce a receiver with different gains.

11. The receiver of a pulsed light signal as claimed in claim 10, comprising at least another receiving channel with an attenuation pad, multiplexed with said receiving channels, each receiving channel with an attenuation pad having a different attenuation.

12. The receiver of a pulsed light signal as claimed in claim 1, wherein the transimpedance amplifier includes an operational amplifier or an amplifier with discrete components.

13. The receiver of a pulsed light signal as claimed in claim 1, wherein the light signal is capable of generating current pulses in the range from 10 nA to 100 mA in the photodiode.

14. The receiver of a pulsed light signal as claimed in claim 1, wherein $\alpha$ is in the range from 2 to 30.

15. A Lidar including a receiver of a pulsed light signal as claimed in claim 1.

16. A distance gauge equipped with a receiver as claimed in claim 1.

17. The distance gauge as claimed in claim 16, further equipped with a designation laser.

* * * * *